United States Patent [19]

Hawrylo et al.

[11] 4,024,569

[45] May 17, 1977

[54] SEMICONDUCTOR OHMIC CONTACT

[75] Inventors: Frank Zygmunt Hawrylo, Trenton; Henry Kressel, Elizabeth, both of N.J.

[73] Assignee: RCA Corporation, New York, N.Y.

[22] Filed: Jan. 8, 1975

[21] Appl. No.: 539,532

[52] U.S. Cl. .................................. 357/71; 357/16; 357/60; 357/61; 357/63; 357/65; 357/90
[51] Int. Cl.² ................ H01L 29/161; H01L 29/04; H01L 29/167; H01L 23/48
[58] Field of Search ................ 357/71, 16, 60, 61, 357/63, 65, 90

[56] References Cited

UNITED STATES PATENTS

| | | | |
|---|---|---|---|
| 3,632,436 | 1/1972 | Denning | 357/71 |
| 3,684,930 | 8/1972 | Collins et al. | 357/71 |

OTHER PUBLICATIONS

Jour. of App. Physics – Vol. 39, No. 9, Aug. 1968 – YEH et al. "Diffusion of tin into silicon"

*Primary Examiner*—Edward J. Wojciechowicz
*Attorney, Agent, or Firm*—Glenn H. Bruestle; George E. Haas; Daniel N. Calder

[57] ABSTRACT

A semiconductor device has one surface of P type conductivity material having a wide energy bandgap and a large crystal lattice parameter. Applied to the P type surface of the semiconductor device is a degenerate region of semiconductor material, preferably a group III–V semiconductor material, having a narrower energy bandgap. The degenerate region is doped with tin to increase the crystal lattice of the region to more closely approximate the crystal lattice of the one surface of the semiconductor device. The degenerate region is compensatingly doped with a P type conductivity modifier. An electrical contact is applied to one surface of the degenerate region forming an ohmic contact with the semiconductor device.

11 Claims, 1 Drawing Figure

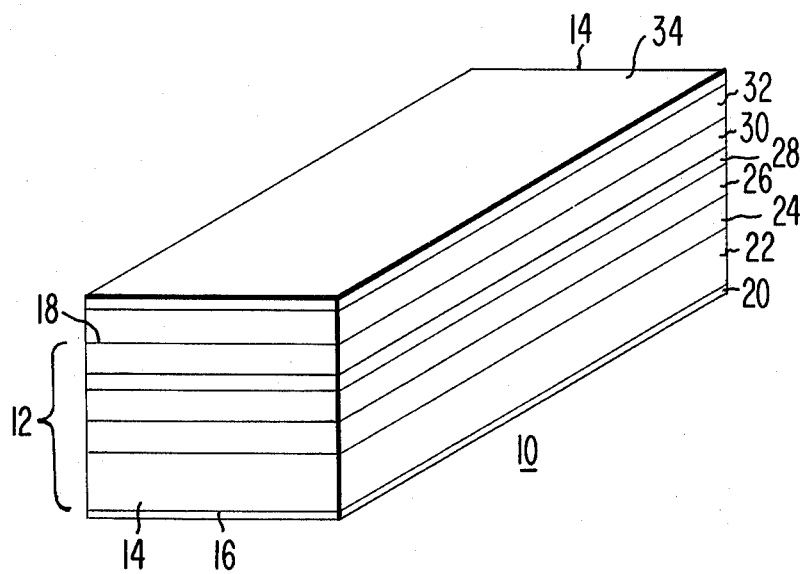

SEMICONDUCTOR OHMIC CONTACT

BACKGROUND OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

The present invention relates to ohmic contacts on wide bandgap P type semiconductor material having a relatively large crystal lattice.

One of the basic problems in manufacturing semiconductor devices lies in attaching electrical leads to the seimconductor material. These metal to semiconductor contacts, commonly called ohmic contacts, must not add significant resistance to the structure on which they are used, and should not alter the equilibrium carrier densities within the semiconductor so as to change the characteristics of the device. Metal to semiconductor contacts may form rectifying barriers which renders them unacceptable for use in this area. Often a highly doped or degenerate semiconductor region is employed to act as an interface between the metal and semiconductor material. This region is doped so that the two resulting contacts, a metal-semiconductor and a semiconductor-semiconductor contact, have relatively linear resistivity.

Satisfactory ohmic contacts are particularly difficult to form on P type semiconductor material having an energy bandgap in excess of 1.6 Ev. Under these circumstances, the degenerate semiconductor region usually has a narrower energy bandgap than the adjacent semiconductor material thus providing a better surface to which the metal contact layer can be applied. However, this creates additional problems with respect to the matching of the crystal lattices of the wide energy bandgap material and the degenerate region. If the lattices of the two semiconductor regions differ substantially, stresses will occur at the interface between the two regions. These stresses may result in a loss of efficiency in the semiconductor and may even cause the semiconductor material to crack at the semiconductor interface thereby physically damaging the device.

SUMMARY OF THE INVENTION

A semiconductor device has one surface composed of a P type conductivity material. The P type conductivity material has a wide energy bandgap and a large crystal lattice. To the surface of the semi-conductor device, a degenerate region of semiconductor material is applied. The material of the degenerate region has a narrower energy bandgap and a higher p type conductivity as compared to the surface of the semiconductor device. The degenerate region is doped with tin to enlarge the crystal lattice of the region to more closely approximate the crystal lattice of the P type conductivity material at the surface of the semiconductor device. Since tin is an N type dopant, a P type conductivity modifier is employed to compensate the doping of the degenerate region. An electrical contact layer is applied to the surface of the degenerate region.

BRIEF DESCRIPTION OF THE DRAWINGS

The figure of the drawing shows a semiconductor device embodying the present invention

DESCRIPTON OF THE INVENTION

The present invention will be described using a semiconductor laser. However, the present invention may be employed as an ohmic contact on other semiconductor devices. With reference to the Figure of the drawing, a semiconductor laser 10 comprises a right parallelepiped body 12 formed of a single crystalline semiconductor material. The body 12 has two end surfaces 14 and opposed first and second surfaces 16 and 18 respectively.

The body 12 includes a highly doped N type substrate 22 extending along the first surface 16. A first epitaxial layer 24 of N type conductivity is contiguous with the substrate 22. An N type second epitaxial layer 26 is on the first layer 24. A third epitaxial layer 28 of P type conductivity material is on the second epitaxial layer 26. The third epitaxial layer 28 is of a material having a narrower energy bandgap width than the material of the second epitaxial layer 26 and forms the recombination region of the laser 10. Extending along the second surface 18 is a fourth epitaxial layer 30 which is also contiguous with the third epitaxial layer 28. The fourth epitaxial layer 30 is of P type conductivity and is of a material having an energy bandgap which is greater than about 1.6 Ev.

A degenerate region 32 composed of semiconductor material, preferably from the III–V compound family, is applied to the second surface 18. The energy bandgap of the degenerate region 32 is less than 1.6 Ex. The crystal lattice parameter of the fourth layer 30 is relatively large as compared to the semiconductor material of the degenerate region 32. Tin is used to dope the degenerate region 32. This tin doping enlarges the crystal lattice parameter of the degenerate region 32 so that it more closely approximates the lattice parameter of the fourth layer 30. The degenerate region 32 is compensatingly doped with a P type conductivity modifier to produce a highly P type conductivity region. The degenerate region 32 should have higher conductivity than the fourth layer 30. A first electrical contact layer 34 is applied to the surface of the degenerate region 32 in a manner so as to form a good ohmic contact. A second electrical contact layer 20 is applied to the first surface 16.

Semiconductor injection lasers, such as the one shown in the drawings are particularly representative of devices on which this invention may be employed. For example, the semiconductor laser 10 may have a body 12 composed of several layers of gallium arsenide and alloys of aluminum gallium arsenide. The fourth epitaxial layer 30 may have an aluminum concentration of about 20% in which case it has an energy bandgap of about 1.68 Ev. and an X-ray lattice parameter of about 5.6548 a. The degenerate region 32 is formed of gallium arsenide with approximately a one atomic percent concentration of tin and is compensated highly P type with a doping of zinc. The crystal lattice parameter of the degenerate region 32 in this example is about 5.654 A.

The laser body 12 and the degenerate region 32 may be grown by liquid phase epitaxy similar to that described in U.S. Pat. No. 3,565,702 issued on Feb. 23, 1971 to H. Nelson. When using this method, the fourth layer 30 in the example may be grown in a refractory furnace boat using a charge of 2 grams of gallium, 280 milligrams of gallium arsenide, 6 milligrams of aluminum, and a P type dopant such as 25 milligrams of zinc.

The charge which is used to grow the degenerate region 32 uses tin as a solvent in which gallium arsenide and a P type dopant are dissolved. The specific charge concentration to form this degenerate region 32 may consist of 2 grams of tin, 360 milligrams of gallium arsenide, and 35 milligrams of zinc. The relatively small concentration of zinc in the solution as compared with the concentration of tin is sufficient to produce a semiconductor region which has a high P type conductivity.

The improved ohmic contact which is formed on the P type surface has several advantages over the previous ohmic contacts. The presence of the degenerate region 32 which has high conductivity and a narrow energy bandgap provides a surface to which a good metal-semiconductor contact can be made. In addition the presence of tin as a dopant in the degenerate region 32 expands the region's crystal lattice parameter. With reference to the above example, the lattice parameter of gallium arsenide is 5.6533 A, whereas the lattice parameter of gallium arsenide doped with one atomic percent of tin is enlarged to about 5,654 A. The enlarged lattice parameter of the degenerate region 32 more closely approximates the lattice size of the third layer 30 (5.6548 A). This improved lattice match reduces the strain at the interface of the degenerate region 32 and the fourth layer 30 reducing the possibility of cracking or separation of the semiconductor material at the interface.

We claim:

1. A simiconductor device comprising:
    a body with one surface of P type conductivity material, siad P type conductivity material having a wide energy bandgap and a large crystal lattice;
    a degenerate region of semiconductor material on the one surface, the material of said degenerate region having a relatively narrow energy bandgap with respect to said P type conductivity material, said degenerate region being doped with tin to enlarge the crystal lattice parameter of the degenerate region and being highly compensated with a P type conductivity modifier; and
    an electrical contact on the surface of the degenerate region.

2. The device as in claim 1 wherein the degenerate region has a crystal lattice closely approximating the crystal lattice of the p type conductivity material.

3. The device as in claim 1 wherein the degenerate region has a greater P type conductivity than said P type conductivity material.

4. The device as in claim 1 wherein the concentration of tin in the degenerate layer is about 1 atomic percent.

5. The device as in claim 1 wherein the P type conductivity material at the one surface of the body has an energy bandgap which is greater than 1.6 Ev.

6. The device as in claim 5 wherein the degenerate region of semiconductor material has an energy bandgap less than 1.6 Ev.

7. The device as in claim 1 wherein the degenerate region is composed of group III-V semiconductor material.

8. The device as in claim 7 wherein the degenerate region is composed of gallium arsenide.

9. The device as in claim 8 wherein the P type conductivity modifier is zinc.

10. The device as in claim 9 wherein the P type conductivity material is an alloy of aluminum gallium arsenide.

11. The device as in claim 1 wherein said device consists of a semiconductor injection laser, said laser composed of a plurality of layers of gallium arsenide and alloys of aluminum gallium arsenide; and
    said degenerate region is composed of gallium arsenide doped with a small amount of tin and compensatedly doped P type with zinc.

* * * * *